(12) United States Patent
Beyer et al.

(10) Patent No.: US 12,381,074 B2
(45) Date of Patent: Aug. 5, 2025

(54) METHOD, CONTROL SYSTEM, AND SYSTEM FOR MACHINING A SEMICONDUCTOR WAFER, AND SEMICONDUCTOR WAFER

(71) Applicant: SILTRONIC AG, Munich (DE)

(72) Inventors: Axel Beyer, Burghausen (DE); Christof Weber, Burghausen (DE); Stefan Welsch, Polling (DE)

(73) Assignee: Siltronic AG, Munich (DE)

( * ) Notice: Subject to any disclaimer, the term of this patent is extended or adjusted under 35 U.S.C. 154(b) by 143 days.

(21) Appl. No.: 18/157,975

(22) Filed: Jan. 23, 2023

(65) Prior Publication Data

US 2023/0170206 A1 Jun. 1, 2023

Related U.S. Application Data

(63) Continuation of application No. 16/625,133, filed as application No. PCT/EP2018/064551 on Jun. 4, 2018, now Pat. No. 11,658,022.

(30) Foreign Application Priority Data

Jun. 21, 2017 (DE) .......................... 102017210450.3

(51) Int. Cl.
*H01L 21/02* (2006.01)

(52) U.S. Cl.
CPC .. *H01L 21/02016* (2013.01); *H01L 21/02019* (2013.01)

(58) Field of Classification Search
CPC ......... H01L 21/02016; H01L 21/02019; H01L 21/67763–67781; H01L 21/02041–02101; H01L 21/02002–02035; H01L 21/02301; H01L 21/02334; H01L 21/02661; H01L 21/4835; H01L 21/4864; H01L 21/4892; H01L 21/67023–67057; H01L 2224/0381; H01L 2224/2781; H01L 2224/3581; H01L 2224/4381; H01L 2224/8001–80019;
(Continued)

(56) References Cited

U.S. PATENT DOCUMENTS 6,299,514 B1 10/2001 Boller
2002/0022351 A1 2/2002 Schmolke et al.
(Continued)

FOREIGN PATENT DOCUMENTS

DE 10007390 A1 10/2000
DE 102005045339 A1 4/2007
(Continued)

*Primary Examiner* — Cuong B Nguyen
(74) *Attorney, Agent, or Firm* — BROOKS KUSHMAN P.C.

(57) ABSTRACT

The invention relates to an epitaxially coated semiconductor wafer, processed by a method in which the semiconductor wafer is disposed on a susceptor in a coating apparatus and processed, wherein an etching gas is passed through the coating apparatus in an etching step. A first side of the semiconductor wafer which has been subjected to a polishing operation by CMP, or a second side of the semiconductor wafer opposite the first side, is coated with a protective layer before processing. The resulting wafer has exceptional geometry, as reflected by low ESFQR values.

15 Claims, 10 Drawing Sheets

(58) Field of Classification Search
CPC ................. H01L 2224/8091–80919; H01L 2224/8101–81019; H01L 2224/81022; H01L 2224/8191–81919; H01L 2224/8201; H01L 2224/8291; H01L 2224/8301–83019; H01L 2224/83022; H01L 2224/8391–83919; H01L 2224/8401–84019; H01L 2224/8591–85919; H01L 2224/8601; H01L 2224/8691; H01L 2224/7501; H01L 2224/7601; H01L 2224/7701; H01L 2224/7801; H01L 2224/7901; H01L 21/02439; H01L 21/02532; H01L 21/02598; H01L 21/02609; H01L 21/0262; H01L 21/02634; H01L 21/30625; H01L 21/02381; C30B 25/02; C30B 29/06; C30B 33/00; C30B 33/12
See application file for complete search history.

(56) References Cited

U.S. PATENT DOCUMENTS

| | | |
|---|---|---|
| 2003/0054650 A1 | 3/2003 | Wenski et al. |
| 2007/0066036 A1 | 3/2007 | Schauer et al. |
| 2007/0259530 A1 | 11/2007 | Feijoo et al. |
| 2009/0076647 A1 | 3/2009 | Numakura |
| 2010/0056027 A1 | 3/2010 | Zapilko et al. |
| 2010/0294197 A1 | 11/2010 | Haberecht |
| 2012/0100701 A1 | 4/2012 | Kawasaki |
| 2014/0008768 A1 | 1/2014 | Sato |
| 2015/0011079 A1* | 1/2015 | Yoshida ............ H01L 21/02532 438/510 |
| 2015/0318185 A1 | 11/2015 | Kodaira et al. |
| 2017/0194136 A1 | 7/2017 | Sato |
| 2018/0342383 A1 | 11/2018 | Roettger et al. |
| 2019/0252180 A1 | 8/2019 | Tanaka |
| 2019/0333775 A1 | 10/2019 | Nishitani |

FOREIGN PATENT DOCUMENTS

| | | |
|---|---|---|
| DE | 102008045534 B4 | 12/2011 |
| DE | 112014001496 T5 | 12/2015 |
| DE | 102015224933 A1 | 6/2017 |
| EP | 1160360 A1 | 12/2001 |
| EP | 1852901 A1 | 4/2007 |
| JP | 2010171330 A | 8/2010 |
| JP | 2010283227 A | 12/2010 |
| JP | 2013016841 A | 1/2013 |
| TW | 201306109 A | 2/2013 |
| TW | 201436031 A | 9/2014 |

* cited by examiner

METHOD, CONTROL SYSTEM, AND SYSTEM FOR MACHINING A SEMICONDUCTOR WAFER, AND SEMICONDUCTOR WAFER

CROSS REFERENCE TO RELATED APPLICATIONS

This application is a continuation of U.S. application Ser. No. 16/625,133, filed Dec. 20, 2019, now U.S. Pat. No. 11,658,022, issued May 23, 2023, which is the U.S. National Phase of PCT Appln. No. PCT/EP2018/064551 filed Jun. 4, 2018, which claims priority to German Application No. 10 2017 210 450.3 filed Jun. 21, 2017, the disclosures of which are incorporated in their entirety by reference herein.

BACKGROUND OF THE INVENTION

1. Field of the Invention

The present invention relates to a method of processing a semiconductor wafer, to a control system for controlling a coating apparatus for processing a semiconductor wafer, to a plant for processing a semiconductor wafer having such processing apparatuses and such a control system, and to a semiconductor wafer.

2. Description of the Related Art

Semiconductor wafers, especially silicon wafers, are suitable, for example, for use in the semiconductor industry, especially for fabrication of highly integrated electronic components, for example microprocessors or memory chips. For modern microelectronics, starting materials ("substrates") having high demands on global and local flatness, edge geometry, thickness distribution, single side-based local flatness ("nanotopology"), and freedom from defects are required.

In order to obtain semiconductor wafers having such properties, these semiconductor wafers can be subjected to various processing operations. These especially include double-sided polishing (called DSP), in which both sides of a semiconductor wafer are processed simultaneously with removal of material in one processing step by means of two working surfaces, preferably in such a way that the processing forces that act on the front and back sides of the semiconductor wafer during the removal of material are essentially in balance and no constraining forces are exerted on the semiconductor wafer by a guide apparatus, i.e. the semiconductor wafer is processed in a "free-floating" manner. In this context, it is especially possible for multiple semiconductor wafers to be inserted into one or more "carrier plates" having recesses for the semiconductor wafers, and then to be polished by forces acting on both sides of the semiconductor wafers. DSP processing of silicon wafers is described, for example, in US 2003/054650 A1, and an apparatus suitable therefor in DE 100 07 390 A1.

A useful further processing operation is chemical-mechanical polishing ("CMP"), as known, for example, from DE 10 2008 045 534 B4. In this case, a semiconductor wafer is pressed by means of a carrier onto a polishing pad (which may be on a polishing plate) and then moved, usually with rotation, under pressure. Through the use of a suitable polishing medium or a polishing medium suspension, one side of the semiconductor wafer is then polished.

A useful further processing operation is a coating operation as known, for example, from DE 10 2005 045 339 A1. In epitaxial coating of semiconductor wafers, for example, in an epitaxial reactor, a deposition gas is passed through the epitaxial reactor, as a result of which material can be epitaxially deposited on a surface of the semiconductor wafers. However, apart from being deposited on the semiconductor wafers, material is always deposited within the epitaxial reactor. It is therefore typically necessary to remove such residues that have been deposited in an uncontrolled manner on surfaces in the epitaxial reactor during deposition, from time to time.

Inhomogeneities occur in all the processing steps mentioned above, both in radial and in circumferential direction. A prominent example to be mentioned here is what is called the fourfold symmetry of the epitaxially deposited layer, one cause of which is different growth rates along different crystal axes.

Against this background, the problem addressed is that of specifying a way of obtaining even better semiconductor wafers, especially with regard to the flatness of their surfaces.

SUMMARY OF THE INVENTION

What are proposed in accordance with the invention are a method, a control system and a plant for processing a semiconductor wafer, and also a semiconductor wafer, wherein embodiments employing protectively coating one side of a wafer to be treated and the use of anti-four fold symmetry etching produces wafers with improved topology.

The invention thus relates to a method of processing a semiconductor wafer, in which the semiconductor wafer is disposed on a susceptor in a coating apparatus. A useful coating apparatus here is especially an epitaxial reactor. This method comprises one or more processing operations, wherein one such processing operation comprises an etching step and optionally a deposition step. In the course of the etching step, an etching gas is passed through the coating apparatus. The etching gas preferably consists of a mixture of hydrogen chloride and hydrogen, although the etching gas may also consist of hydrogen chloride only or of hydrogen only.

DETAILED DESCRIPTION OF THE PREFERRED EMBODIMENTS

Figure 1:
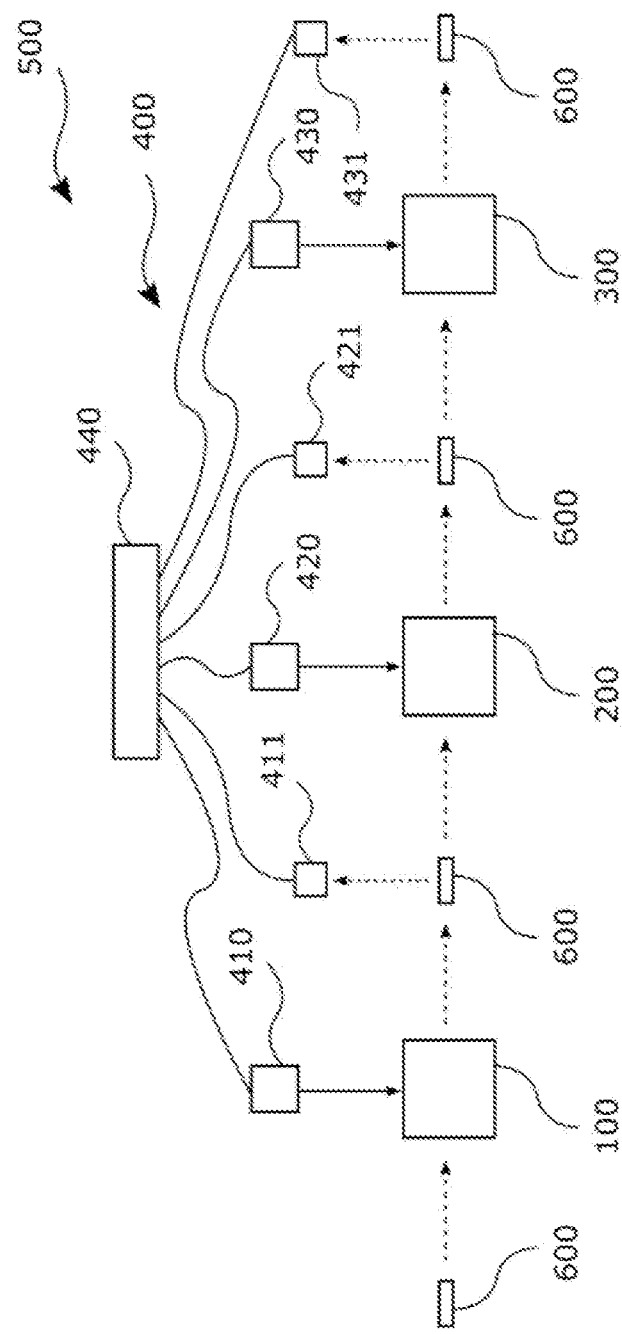
FIG. 1 shows a schematic of a plant of the invention in a preferred embodiment, with which a method of the invention can be performed.

In the course of any deposition step conducted, a deposition gas is passed through the coating apparatus for epitaxial deposition of a layer on the semiconductor wafer. A useful deposition gas here is especially trichlorosilane. It is especially preferable when the processing operation comprises the etching step and then the deposition step.

The etching step can serve to at least partly remove any deposits or depositions in the coating apparatus or in the epitaxial reactor that originate from a preceding deposition step. Such deposits affect the flow of gas in the coating apparatus and also temperature gradients, and hence also the layer depositable epitaxially by the deposition gas on the semiconductor wafer. The etching step can also be utilized to achieve higher removal of material in the middle of the semiconductor wafer than at the edge.

It has now been found that, under the conditions chosen in the context of this invention, material is removed on the side of the semiconductor wafer remote from the susceptor in the etching step, but material is deposited on the side facing the susceptor, especially in the edge region or in the region in which the semiconductor wafer adjoins the susceptor. The way in which this arises is especially that the etching gas (in an equilibrium reaction) dissolves material present in the coating apparatus, for example material deposited in a prior deposition operation, and deposits it again on the semiconductor wafer, or that material present on the susceptor from a prior processing step is bonded to the material of the wafer to be processed and is entrained in the unloading of the coating apparatus.

What is envisaged in accordance with the invention is that one of two sides of the semiconductor wafer is coated with a protective layer prior to the processing operation. A first side (FS) of the semiconductor wafer that has been subjected to a polishing operation by CMP (chemical mechanical polishing), or a second side (BS) of the semiconductor wafer which is opposite the first side and may have been subjected to a polishing operation by CMP, is coated. Preferably, the semiconductor wafer which is coated with a protective layer is a semiconductor wafer having first and second sides that have been polished simultaneously by double-sided polishing (DSP), the first side (FS) of which has been polished in a polishing operation by CMP after the double-sided polishing. The semiconductor wafer is preferably a semiconductor wafer composed of monocrystalline silicon and preferably has a diameter of not less than 200 mm, more preferably a diameter of not less than 300 mm. Useful protective layers preferably include an oxide layer, especially a low-temperature oxide (LTO) layer. The term "low-temperature oxide layer" or "LTO" refers here to an oxide layer applied by a particular method. A conceivable example is silicon dioxide. A thickness of the layer may be at most 200 nm, preferably at most 150 nm, more preferably at most 100 nm, in order to achieve particularly good results. The protective layer may additionally appropriately be formed with an edge exclusion of not more than 0.5 mm, preferably not more than 0.2 mm, more preferably not more than 0.1 mm, meaning that a corresponding region at the edge of the semiconductor wafer is not coated or covered by the protective layer. In that case, the etching step can appropriately be undertaken at a temperature between 1000° C. and 1250° C., preferably between 1100° C. and 1150° C., in the coating apparatus. The protective layer may alternatively be a protective layer of silicon dioxide which is produced by an RTA (rapid thermal anneal) heat treatment.

The presence of the protective layer on the first side (FS) or the second side (BS) prevents material from being removed from the side of the semiconductor wafer provided with the protective layer in the etching step. This exploits the fact that, for example, an oxide of a semiconductor material is attacked and hence eroded to a much lesser degree by the etching gas than the corresponding pure semiconductor material. Moreover, the material transport on contact with the susceptor that has been described at the outset and deposition of material is also prevented by the protective layer.

If the protective layer is on that side which is remote from the susceptor during the etching step, the operation of removal of material from this side does not occur. In a first preferred embodiment of the invention, the first side (FS) is that side provided with the protective layer, and the second side (BS) is that facing the susceptor during the etching step. The etching step is employed in this case in order to deposit material especially in the edge region of the second side (BS). After the etching step and the removal of the protective layer, an epitaxial layer can be deposited on the first side (FS).

If the protective layer, during the etching step, is on that side which faces the susceptor during the etching step, the operation of material deposition especially in the edge region of this side does not occur. In a second preferred embodiment of the invention, the second side (BS) is that side which has been provided with the protective layer and which is facing the susceptor during the etching step. The etching step is employed in this case in order to remove material from the first side (FS). Preferably, the etching step is followed by a deposition step, in the course of which an epitaxial layer is deposited on the first side (FS). The protective layer is removed before or after the deposition of the epitaxial layer.

In a third preferred embodiment of the invention, the processing operation is divided into a first etching step and a second etching step, and the second etching step is followed by a deposition step, in the course of which an epitaxial layer is deposited on the first side (FS). During the first etching step, the first side (FS) is that side which has been provided with the protective layer, and the second side (BS) is that facing the susceptor during the etching step. After the first etching step, the protective layer is removed from the first side (FS) and the second side (BS) is provided with the protective layer. During the second etching step, the second side (BS) is that side which has been provided with the protective layer and which is facing the susceptor. The protective layer is removed from the second side (BS) after the second etching step or after the deposition of the epitaxial layer on the first side (FS) of the semiconductor wafer.

If the method is conducted in one of the embodiments described, the two sides of the semiconductor wafer can be processed independently of one another and in a controlled manner.

The second preferred embodiment of the invention is suitable especially in order to counteract symmetric variation in thickness that occurs in the edge region of the semiconductor wafer after coating of the semiconductor wafer with an epitaxial layer. The variation in thickness is due to the fact that, in the deposition of the epitaxial layer, material is deposited at different rates in the edge region depending on the polar angle. For example, an epitaxial layer of monocrystalline silicon, without additional measures, grows more quickly at polar angle positions of 0°, 90°, 180° and 270° than at polar angle positions offset by 45° relative to the positions mentioned on a {100}-oriented semiconductor wafer of monocrystalline silicon having an orientation notch that indicates a <110> direction and defines the polar angle position of 0°. The thickness of the epitaxially coated semiconductor wafer is therefore greater in four regions of the circumference at equal distances from one another than in the regions in between (called fourfold symmetry).

It has been found that the thickness of the epitaxially coated semiconductor wafer in the edge region can be homogenized when, prior to the deposition of the epitaxial layer, the process according to the second preferred embodiment of the invention is conducted. The rate of material removal that takes place in the course of the etching step on the first side (FS) is greater in the edge region at those points where material is deposited at the higher rate during the deposition of the epitaxial layer. This effect that occurs in the course of the etching step is referred to hereinafter as anti-fourfold symmetry etching (4FSE). The removal of material to be achieved locally is especially guided by the duration of the etching step. For instance, it is possible to use the procedure in the second preferred embodiment of the invention in combination with the deposition of an epitaxial layer in order to obtain an epitaxially coated semiconductor wafer having a more homogeneous thickness profile in a circumferential direction.

The second preferred embodiment of the invention is therefore preferably employed in order to produce a semiconductor wafer of silicon in which the first side (FS) has been coated with an epitaxial layer of silicon and in which the first side (FS) has a {100} orientation or a {110} orientation.

The first preferred embodiment of the invention is especially suitable in order to counteract any edge roll-off that has been caused by DSP and possibly by CMP on the first side (FS) and/or second side (BS). The material deposited in the edge region of the second side (BS) locally increases the thickness of the semiconductor wafer and ensures that the radial profile of the thickness is homogenized. The amount and position of the material deposited can be affected by configuring the susceptor and via the duration of the etching step. At least within a period of 60 s of etching time, linear growth of deposited material is to be observed. The susceptor preferably has a ledge inclined downward, on which the semiconductor wafer rests in the edge region. The radial width of the ledge and the angle of inclination of the ledge are influencing parameters that should especially be taken into account in the configuring of the susceptor.

The third preferred embodiment of the invention essentially comprises a combination of the first preferred embodiment and the second preferred embodiment.

During the etching step or during the first and second etching steps, the volume flow rate of hydrogen chloride is preferably not less than 2 slm and not more than 5 slm; the volume flow rate of hydrogen is preferably not less than 30 slm and not more than 110 slm, more preferably not less than 40 slm and not more than 70 slm (standard liters per minute). Particularly smooth surfaces result at a volume flow rate of hydrogen chloride of 4 slm and a volume flow rate of hydrogen of 50 slm. These gas flow rates can achieve, for example, higher removal of material in the middle of the semiconductor wafer than at the edge.

The proposed process, with regard to the anti-fourfold symmetry etching (4FSE), allows a reduction in the fourfold symmetry after the coating, with longer durations of the etching step (with flow of etching gas) leading to lesser remaining fourfold symmetry. A maximum possible duration in the procedure conventionally results from the fact that the deposition on the second side (BS), in the case of excessively long durations of the etching step, leads to a deterioration in the local geometry (flatness) of the semiconductor wafer. This problem is solved here by the protective layer, since the unwanted material deposition is suppressed. In addition, by skillful combination of the inhomogeneities that occur in processing with the coating apparatus and other preceding polishing operations, distinctly better flatness close to the edge can be achieved than to date.

It should be noted that a processing operation after the etching step may also—as is customary—include a deposition step in which the protective layer is then also present. However, it is also possible to use just an etching step in order to selectively remove material only, but not to deposit material again. In the case of multiple processing operations, it is also conceivable to conduct the deposition step only in some of the processing operations, i.e., for example, only in the first of two.

With the method proposed, it is possible to obtain semiconductor wafers, especially silicon wafers, having much better values with regard to the demands stated at the outset. A semiconductor wafer of this kind may be a semiconductor wafer of monocrystalline silicon having at least one side face which has been polished by CMP, or a semiconductor wafer of monocrystalline silicon that has been epitaxially coated with a layer of monocrystalline silicon. The semiconductor wafer has an $ESFQR_{max}$ of not more than 5 nm with an edge exclusion of not more than 2 mm and 72 sectors each having a length of 30 mm. Preferably, the semiconductor wafer has an $ESFQR_{max}$ of not more than 10 nm with an edge exclusion of not more than 1 mm and 72 sectors each having a length of 30 mm. More preferably, the semiconductor wafer has an $ESFQR_{max}$ of not more than 15 nm with an edge exclusion of not more than 0.5 mm and 72 sectors each having a length of 30 mm. Semiconductor wafers of this kind also form part of the subject matter of the present invention.

SFQR stands for "Site Frontsurface-referenced least-sQuares/Range", and the value thereof indicates the flatness of the semiconductor wafer. More particularly, this correlates positive and negative deviations of a surface from a flat reference surface. In general, the deviations are each used for the calculation for an area having particular dimensions at the surface of the semiconductor wafer. ESFQR stands for "Edge Site Frontsurface-referenced least sQuares/Range", and the value thereof is defined as for the SFQR value, but only for an edge region of the semiconductor wafer.

$ESFQD_{av}$ stands for "Edge Site Frontsurface-referenced least sQuares/Deviation", and the index av denotes the average of the ESFQD values of edge sites in the circumferential region of the semiconductor wafer. Typically, the circumferential region comprises 72 sites of this kind (sectors).

Definitions and test methods for the wafer parameters mentioned are included in the standards SEMI M67 (ESFQR and ESFQD) and SEMI M1, 5 SEMI MF1530 and SEMI M49 (SFQR).

A further advantage of the protective layer when it is adjoining the susceptor during a deposition step is that the semiconductor wafer cannot become fixed to the susceptor through growth. The reason for this is that the protective layer is of a different material. For example, silicon dioxide barely bonds to silicon. What can be achieved in this way is that, on removal of the semiconductor wafer from the susceptor, no material is removed from the susceptor as well and thus, more particularly, only distinctly smaller stresses, if any, occur in the semiconductor wafer, especially in the edge region. This effect already occurs on the heating of the coating apparatus, i.e. irrespective of whether an etching step or a deposition step is conducted or not.

Preferably, the protective layer, after a processing operation—especially depending on what is subsequently supposed to happen to the semiconductor wafer—is removed again from the semiconductor wafer. For example, a further processing operation can then be effected, before which the other side is provided with the protective layer. At the end of all processing operations to be conducted with the coating apparatus, the protective layer can be removed in order to obtain the finished semiconductor wafer. The protective layer can, especially in the case of an oxide layer on a silicon wafer, be removed using hydrofluoric acid (HF), for example, since hydrofluoric acid dissolves the oxide, but not silicon.

It is also particularly preferable when the semiconductor wafer is polished on at least one of the two sides in one or more polishing operations with a polishing apparatus before the one or more processing operations. An appropriate apparatus here is the polishing apparatus mentioned at the outset for chemical-mechanical polishing (CMP), which permits controlled processing of just one side. More particularly, polishing can be effected here in such a way that, in radial direction of the semiconductor wafer, regions are affected to different degrees in processing, especially in each case by specification of different pressures onto the regions of the semiconductor wafer.

Such different pressures can be generated, for example, by a suitably designed carrier of the corresponding polishing apparatus, by means of which the pressure is exerted on the semiconductor wafer. It is thus possible to define the pressure specifically for individual regions or else zones of the semiconductor wafer. It is thus possible to define recipes (for the corresponding operating parameters of the polishing apparatus) individually for each semiconductor wafer. It is thus especially possible to counteract the unwanted components of the material buildup at the edge of the semiconductor wafer that occurs in the coating apparatus in the subsequent processing operation.

It is particularly advantageous here when at least one operating parameter in a polishing operation is defined as a function of at least one operating parameter in the processing operation and/or as a function of a wafer parameter to be expected by virtue of the polishing operation or processing operation. Useful wafer parameters include, for example, the $ESFQD_{av}$ value or other parameters by which the flatness or planarity can be reported. In this way, it is thus possible, in a controlled manner, to exploit interactions between the polishing operation on the one hand and the processing operation in the coating apparatus on the other hand in order to achieve flatter semiconductor wafers overall. More particularly, it is namely possible to compensate for any adverse removal of material in the polishing operation in a controlled manner in the coating, and vice versa. In particular, it is possible in this way also to give consideration to operating parameters for the individual apparatuses that would not be considered in conventional processes in which each apparatus is optimized individually, since they would give, for example, poorer results for the individual apparatus per se. However, this is no longer the case with combined consideration of multiple apparatuses.

For the sake of completeness, it should also be noted that, prior to a polishing operation for chemical-mechanical polishing, a polishing operation for double-sided polishing (as mentioned at the outset) may also be provided. This polishing operation too can then be taken into account with regard to its operating parameters for the other polishing and/or processing operations and their operating parameters.

The invention further provides a control system for controlling a coating apparatus for processing a semiconductor wafer, in which an etching gas can be passed through and/or a layer can be deposited epitaxially on the semiconductor wafer in a processing operation, and especially also for controlling a polishing apparatus in which the semiconductor wafer can be polished in a polishing operation. This control system has been set up, in the case of use with the coating apparatus, and especially also of the polishing apparatus, to conduct a method of the invention.

The invention further provides a plant for processing a semiconductor wafer, having a coating apparatus in which an etching gas can be passed through in a processing operation and/or a layer can be deposited epitaxially on the semiconductor wafer, and especially also having a polishing apparatus in which the semiconductor wafer can be polished in a polishing operation, and also having a control system of the invention.

With regard to further configurations and advantages and the control system and the plant, in order to avoid repetition, reference is made to the remarks on the method proposed, which are correspondingly applicable here.

Further advantages and embodiments of the invention will be apparent from the description and the appended drawings.

It will be appreciated that the features identified above and those still to be elucidated hereinafter can be used not only in the particular combination indicated but also in other combinations, or on their own, without departing from the scope of the present invention.

The invention is described hereinafter with reference to drawings.

FIG. 1 shows a schematic of a plant 500 of the invention in a preferred embodiment, with which a method of the invention can be performed. The plant 500 serves for processing of a semiconductor wafer 600 and comprises, as processing apparatuses, a first polishing apparatus 100, a second polishing apparatus 200 and a coating apparatus 300. These three processing apparatuses serve for processing of a semiconductor wafer 600, which can pass through the individual processing apparatuses successively. For the sake of completeness, it should be mentioned once again at this point that it is also possible for further processing apparatuses to be provided before, between and/or after the processing apparatuses, but these are at least barely of any relevance, if any, for the present invention. Of particular relevance for the present invention are the coating apparatus 300 and—according to the embodiment—also the second polishing apparatus 200, incidentally also referred to merely as polishing apparatus. Nevertheless, the processing of the semiconductor wafer can also be effected using the first polishing apparatus 100 shown here, which more particularly is indeed customary. For a more detailed description of the individual processing apparatuses, reference is made at this point to FIGS. 2 to 4.

In addition, the plant 500 comprises a control system 400 which can be used together with the three processing apparatuses shown, in order to actuate or to operate them. In the example shown, the control system 400 comprises three individual control units 410, 420 and 430, each of which are provided for actuation or for operation of one of the three processing apparatuses. By means of the respective control unit, it is especially possible to define or set at least one operating parameter in each case for the respective processing apparatus.

For each of the control units 410, 420 and 430, a respective measurement apparatus 411, 421 and 431 is provided in each case. By means of these measuring apparatuses, it is possible to measure a semiconductor wafer after it has been processed in the respective processing apparatus with regard to at least one wafer parameter. It will be apparent that such measurement apparatuses—according to the application—may also be integrated into the respective control unit.

In addition, a central control unit 440 is shown here, which is connected to each of the control units 410, 420 and 430 and to each of the measurement apparatuses 411, 421 and 431. Such a connection comprises at least one connection for data transfer, for example in wired or wireless form. The values determined by the individual measurement apparatuses 411, 421 and 431 can be transmitted in this way to the central control unit 440, such that, by means of the central control unit 440, it is then possible to determine suitable operating parameters for the respective processing apparatuses, which can then be transmitted to the respective control unit 410, 420 or 430. It will be apparent that the determination of the respective processing parameters can also be effected in some other way, for example directly in one of the individual control units.

Figure 2:
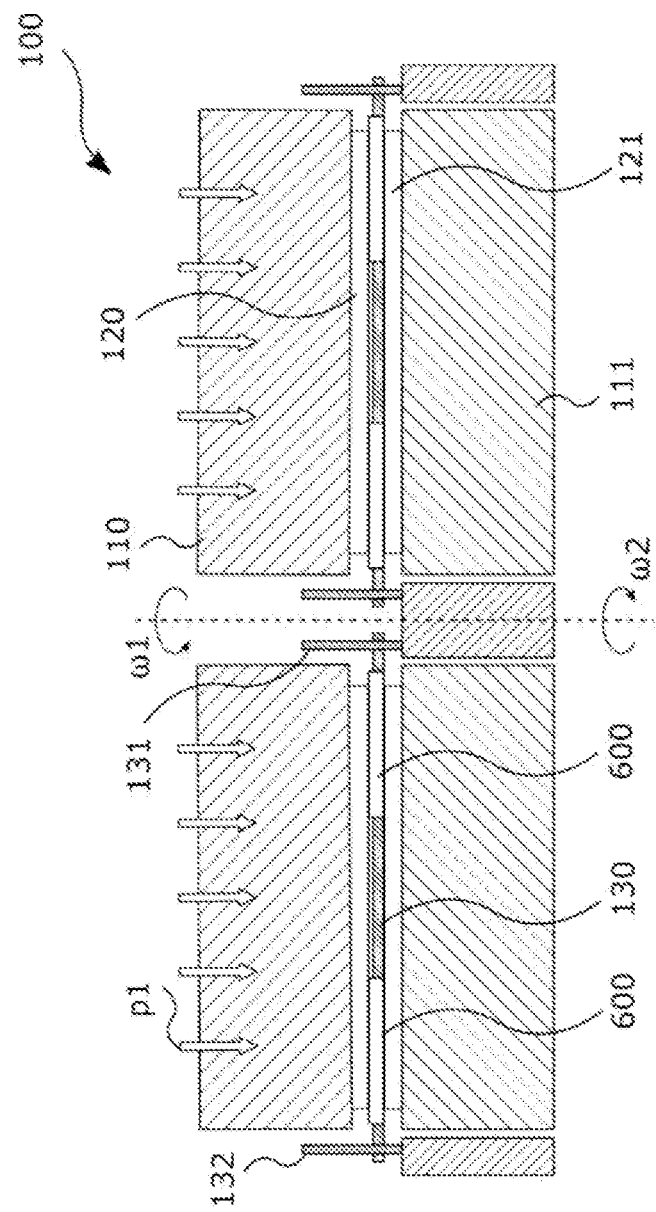
FIG. 2 shows a schematic of a first polishing apparatus as usable in the context of a method of the invention.

FIG. 2 shows, in schematic form and in more detail than in FIG. 1, a first polishing apparatus 100 (for DSP) in cross section. In this case, four semiconductor wafers 600 (of which only two in the left-hand half are given a reference numeral) in corresponding recesses of carrier plates 130 which are moved by means of an inner ring gear 131 and an outer ring gear 132, called a rolling apparatus, are inserted between an upper polishing plate 110 and a lower polishing plate 111.

There is a polishing pad 121 on the lower polishing plate 111. There is a polishing pad 120 on the upper polishing plate 210. The polishing plate 110 together with the polishing pad 120 is pressed in the direction of the polishing or contact pressure p1 against the carrier plates 130, the semiconductor wafers 600 and the lower polishing plate 111 with the polishing pad 121.

The upper polishing plate 110 and the lower polishing plate 111 can be turned or rotated at the rotational velocities ω1 and ω2. The two rotational velocities are shown here in opposing directions, but these may also have, for example and according to the application, the same direction of rotation but different magnitudes. It is likewise conceivable to alter the rotational velocities during operation—and likewise the contact or polishing pressure. For polishing, it is possible here to apply a suitable polishing medium to the polishing pads.

Figure 3:
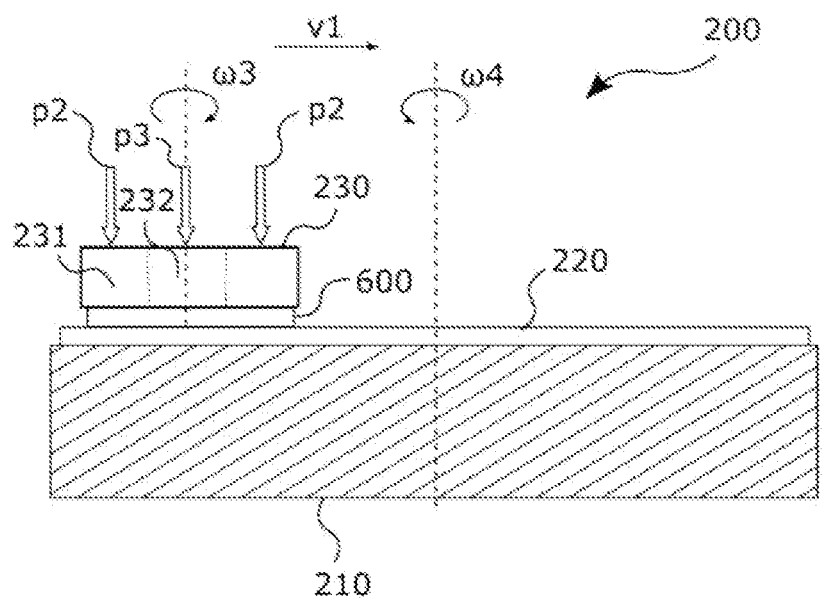
FIG. 3 shows a schematic of a second polishing apparatus as usable in the context of a method of the invention.

FIG. 3 shows, in schematic form and in more detail than in FIG. 1, a (second) polishing apparatus 200 (for CMP) in a preferred embodiment as usable in the context of a method of the invention, in cross section. The semiconductor wafer 600 here has been applied to a polishing pad 220, which is in turn disposed on a polishing plate 210. By means of a carrier 230, the semiconductor wafer 600 is pressed onto the polishing pad 220. During the polishing, the carrier 230 rotates about a first axis with the rotational velocity ω3, and the polishing plate 210 rotates about a second axis with the rotational velocity ω4. In addition, the carrier can be moved at a radial velocity v1 (either inward or outward). For polishing, it is possible here to apply a suitable polishing medium to the polishing pads.

More particularly, it is additionally the case that, by means of the carrier 230, the pressures that can be exerted on the semiconductor wafer 600 can be set differently for different regions. In the simplified example shown, a pressure p2 can be exerted in the radially outer region 231, and a pressure p3 in the radially inner region 232. These pressures p2 and p3 in particular are useful operating parameters for the second polishing apparatus. It is likewise conceivable to use both the rotational velocities ω3 and ω4 and the radial velocity v1 additionally or alternatively as operating parameters.

The pressures may be chosen such that, for example, the pressure p2 is greater than the pressure p3. More particularly, the pressures may alternatively be set specifically with regard to their magnitude. It will be apparent that even more different regions may be provided in radial direction, in which the pressure is individually adjustable.

Figure 4:
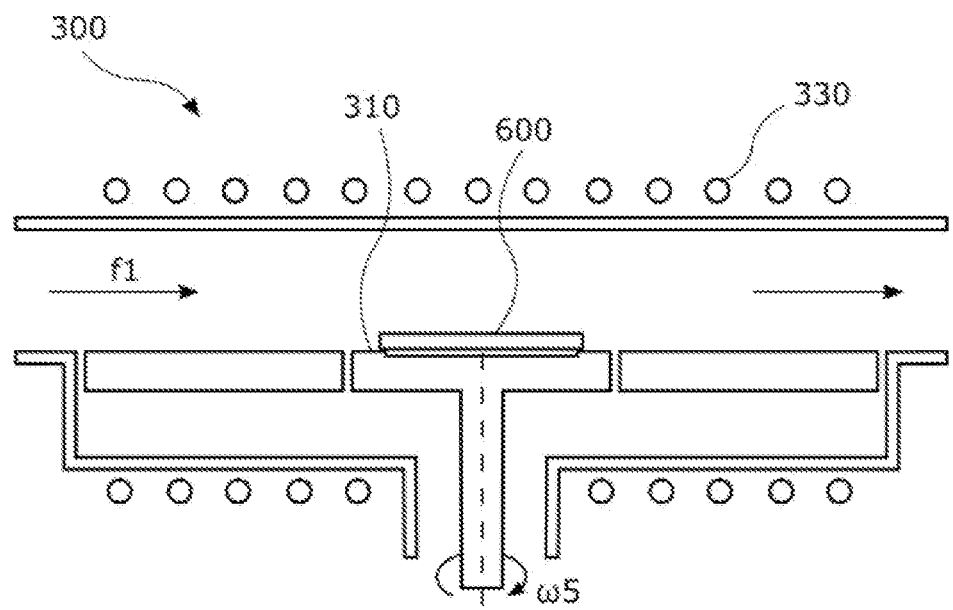
FIG. 4 shows a schematic of a coating apparatus as usable in the context of a method of the invention.

FIG. 4 shows, in schematic form and in more detail than in FIG. 1, a coating apparatus 300 in a preferred embodiment, here in the form of a gas phase epitaxial reactor as usable in the context of a method of the invention, in cross section. In the middle of the coating apparatus 300 there is a susceptor 310 on which a semiconductor wafer 600 to be coated can be disposed, i.e. placed. The susceptor 310 has a depression in the middle, such that the semiconductor wafer 600 lies on the susceptor 310, for example, only in the region of a few millimeters of its edge.

Gas can be passed through the epitaxial reactor 300, in the present example from an opening on the left-hand side as far as an opening on the right-hand side of the epitaxial reactor 300, as indicated by two arrows. By means of heat generators, for example heating lamps 330 at the upper and lower sides of the epitaxial reactor 300, of which one by way of example has been provided with a reference numeral, the gas passed through the epitaxial reactor 300 and the semiconductor wafer can be brought to a desired temperature as required.

In the context of a coating operation, an etching gas, for example a mixture of hydrogen chloride and hydrogen, is then passed through the epitaxial reactor 300 in an etching step, such that the semiconductor wafer is pretreated in a controlled manner before any subsequent deposition step. Without such a subsequent deposition step, it is also possible, for example, for just a controlled removal of material to be effected. Preferably, the volume flow rate of hydrogen chloride can be set here to 4 slm, and the volume flow rate of hydrogen to 50 slm.

For coating of a semiconductor wafer 600 or for epitaxial deposition of a layer, a deposition gas, for example trichlorosilane, optionally mixed with hydrogen, is then passed through the epitaxial reactor 300. Volume flow rate f1 and/or duration of the passage and/or temperature can be adjusted here, for example, according to the desired thickness of the layer to be deposited epitaxially on the semiconductor wafer 600 as operating parameters. In addition, the susceptor 310 with the semiconductor wafer 600 disposed thereon can be rotated about an axis with a definable rotational velocity ω5, which is likewise an additional or alternative operating parameter, as indicated in the figure. In this way, homogeneous deposition of the epitaxial layer can be achieved.

In the context of a coating operation, prior to the passage of the deposition gas, an etching gas, for example a mixture of hydrogen chloride and hydrogen, can then be passed through the epitaxial reactor 300 in an etching step, such that the semiconductor wafer is pretreated in a controlled manner before the actual coating operation. Preferably, the volume flow rate of hydrogen chloride can be set here to 4 slm, and the volume flow rate of hydrogen to 50 slm.

Figure 5:
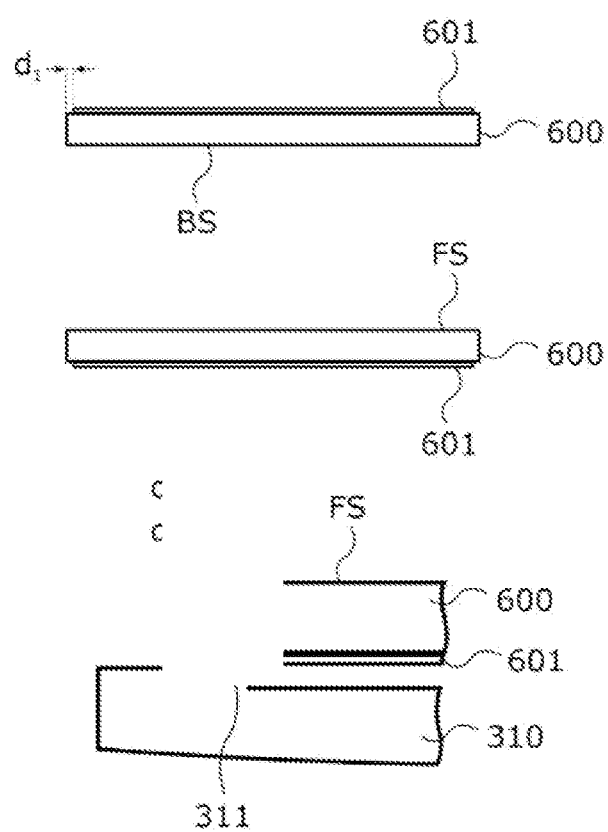
FIG. 5 shows a schematic of a semiconductor wafer with a protective layer in various views.

FIG. 5 shows a semiconductor wafer 600 in various views, as usable in a method of the invention in various preferred embodiments.

In the upper view, a protective layer 601, for example silicon dioxide, has been applied to a first side (FS) of two sides of the semiconductor wafer 600. Silicon dioxide can be applied, for example, by customary methods in which the layer is then in the form of an LTO (low-temperature oxide) layer. The second side (BS) of the two sides is uncoated. The protective layer 601 is provided here up to an edge exclusion $d_1$ which may, for example, be 0.1 mm.

In the middle view, a protective layer 601, for example likewise silicon dioxide, has been applied on the second side (BS) of the semiconductor wafer 600. The first side (FS) is uncoated.

In the lower view, the semiconductor wafer 600 has now been applied to the susceptor 310 of the coating apparatus or of the epitaxial reactor 300, as already similarly shown in FIG. 4. In this case, the protective layer 601 has been applied on the second side (BS), on which the semiconductor wafer 600 then also lies on the susceptor 310 in an application region 311 of the susceptor 310. The semiconductor wafer overlaps with the application region 311 or the susceptor 310 in radial direction by a measure $d_2$. This measure $d_2$ may, for example, be 1 mm. It should be noted in this regard that the figures are not to scale; instead, individual measures are disproportionate.

Figure 6:
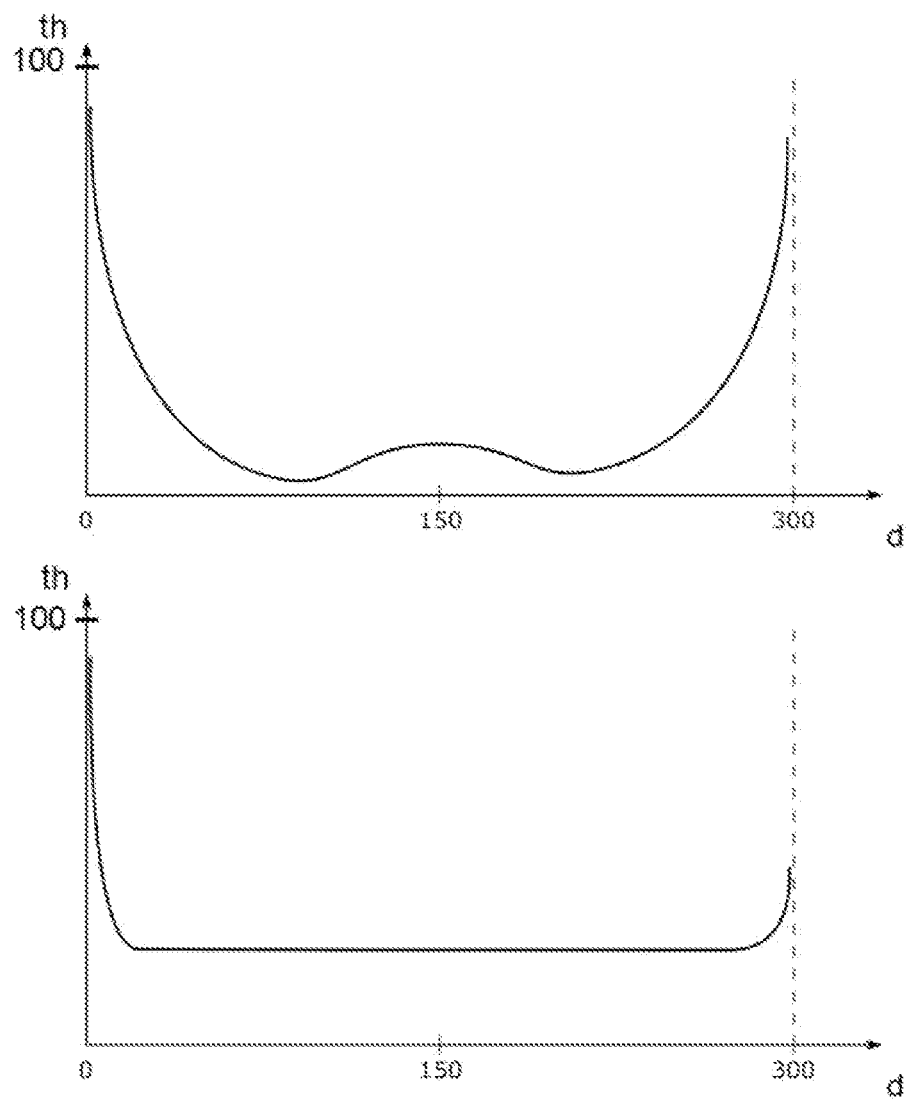
FIG. 6 shows a schematic of the profile of the difference in thickness across the diameter of two semiconductor wafers after undergoing an etching step in a coating apparatus in the context of a method of the invention.

FIG. 6 shows, in each case, the radial profile of the difference in thickness th in nm across the diameter d in mm for two semiconductor wafers after passing through a coating apparatus in the context of a method of the invention, here in each case after an etching step in the coating apparatus having a duration of 60 s, in which one side was covered with the semiconductor wafer having a protective layer. The difference in thickness is found by comparison of the thickness of the respective semiconductor wafer measured before and after the etching step. For reasons of legibility of the graph, a global offset has been subtracted such that the minimum in the wafer thickness is close to zero.

The drawing at the top shows a typical profile of the difference in thickness that results when the second side (BS) is covered with the protective layer during the etching step and this side is that facing the susceptor. It can clearly be seen here that differences occur in the material removal in radial direction. Owing to the protective layer, this is removal of material essentially from the first side (FS).

The drawing at the bottom shows a typical profile of the difference in thickness when the first side (FS) is covered with the protective layer during the etching step and the second side (BS) is that facing the susceptor. It can clearly be seen here that, during the etching step, there is selective growth of material very close to the edge, i.e. especially in the region that rests on the susceptor, as shown in FIG. 5 at the bottom. Owing to the protective layer on the first side (FS), this is material deposited essentially on the second side (BS).

By means of the method proposed, it is therefore especially possible to process the two sides of the semiconductor wafer separately from one another, and to utilize the modes of action of material removal and material growth separately from one another and in a controlled manner. More particularly, for each processing operation, it is possible to establish a set of operating parameters tailored for the processing of one side. Without the protective layer, this would not be possible because the processing operation would simultaneously alter the characteristics of both sides, irrespective of the operating parameters chosen.

Figure 7:
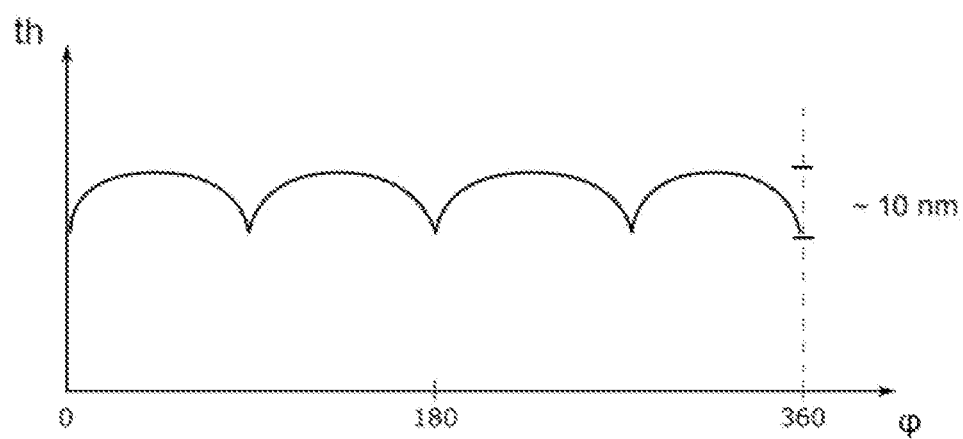
FIG. 7 shows a schematic of the profile of the difference in thickness across the circumference of a semiconductor wafer after undergoing an etching step in a coating apparatus in the context of a method of the invention.

FIG. 7 shows, in schematic form, a typical profile of the difference in thickness th in circumferential direction (versus the polar angle φ in ° with a radius around 148 mm) of a semiconductor wafer with the {100} orientation already mentioned after undergoing an etching step in a coating apparatus when, during the etching step, the second side (BS) has been covered with the protective layer and the second side (BS) is that facing the susceptor.

Figure 8:
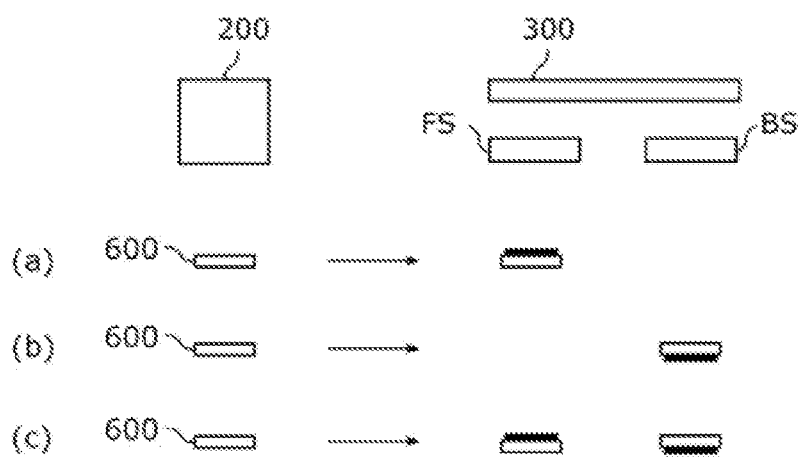
FIG. 8 shows a schematic of the procedures of three preferred embodiments of the method of the invention.

Four regions each offset by 90° are clearly apparent, in which the removal of material is much greater. Owing to the crystal structure, it is found that the removal of material is greater here when the etching gas is employed than in the regions in between. The difference in thickness is about 10 nm. The position of the regions having the greater removal of material at the circumference of the semiconductor wafer corresponds to the position of the four regions where an epitaxial layer grows more quickly. This result can be utilized, preferably by combining the etching step and the deposition step with the aim that the greater removal of material in the course of the etching step and the greater increase in material in the course of the deposition step result in the thickness of the epitaxially coated semiconductor wafer being virtually homogeneous in circumferential direction and having a desired value FIG. 8 shows a schematic of the procedures of three preferred embodiments of the method of the invention. Regardless of this, the invention also includes embodiments that relate to a non-illustrated combination of coating of a particular side of the semiconductor wafer with a protective layer and laying of a particular side on the susceptor of the coating apparatus in order that this side faces the susceptor. The preferred embodiments (a), (b) and (c) shown comprise, first of all, a polishing operation by means of the polishing apparatus 200. It will be apparent that the polishing operation (CMP here) may also be preceded by other processing operations (including other polishing operations such as, more particularly, a DSP polishing operation in which both sides are polished simultaneously). The polished semiconductor wafer has a radial thickness profile.

In the course of the first preferred embodiment (a), in the coating apparatus, an etching step is undertaken, wherein the first side (FS) of the semiconductor wafer is provided with the protective layer and placed on the susceptor such that the second side (BS) faces the susceptor. In this way, by means of the etching step, material can be deposited in a controlled manner at the edge of the second side (BS), for example in order to counteract an edge roll-off that has been produced by a prior polishing operation. After the removal of the protective layer, the result is a semiconductor wafer having at least one side polished by CMP and particularly homogeneous thickness, especially in the edge region. More particularly, a comparatively low $ESFQR_{max}$ value is achieved even with low edge exclusion.

In the second preferred embodiment (b), in the coating apparatus, an etching step is undertaken, wherein the second side (BS) of the semiconductor wafer is provided with the protective layer and the semiconductor wafer is placed on the susceptor such that the second side faces the susceptor. In this way, material can be removed in a controlled manner from the first side (FS), for example with the aim of creating the prerequisites to result in minimum differences in thickness owing to the fourfold symmetry in a subsequent deposition of an epitaxial layer on the first side (FS). At the same time, unwanted growth of material on the second side (BS) is counteracted, this having an adverse effect on the local flatness of the semiconductor wafer.

In the third preferred embodiment (c), the first and second preferred embodiments (a) and (b) are essentially combined. The etching step is divided into a first etching step and a second etching step. After the polishing operation, a first protective layer is formed on the first side (FS), and the semiconductor wafer is placed on the susceptor in such a way that the second side faces the susceptor. Then, in the coating apparatus 300, the first etching step is undertaken, in the course of which material is deposited in the edge region of the second side (BS). Subsequently, the first protective layer is removed from the first side (FS), and a second protective layer is formed on the second side (BS). Thereafter, in the coating apparatus 300, the second etching step is undertaken, in the course of which material is removed from the first side (FS). After the second etching step, the deposition step is undertaken in the coating apparatus, in the course of which an epitaxial layer is deposited on the first side (FS).

Figure 9:
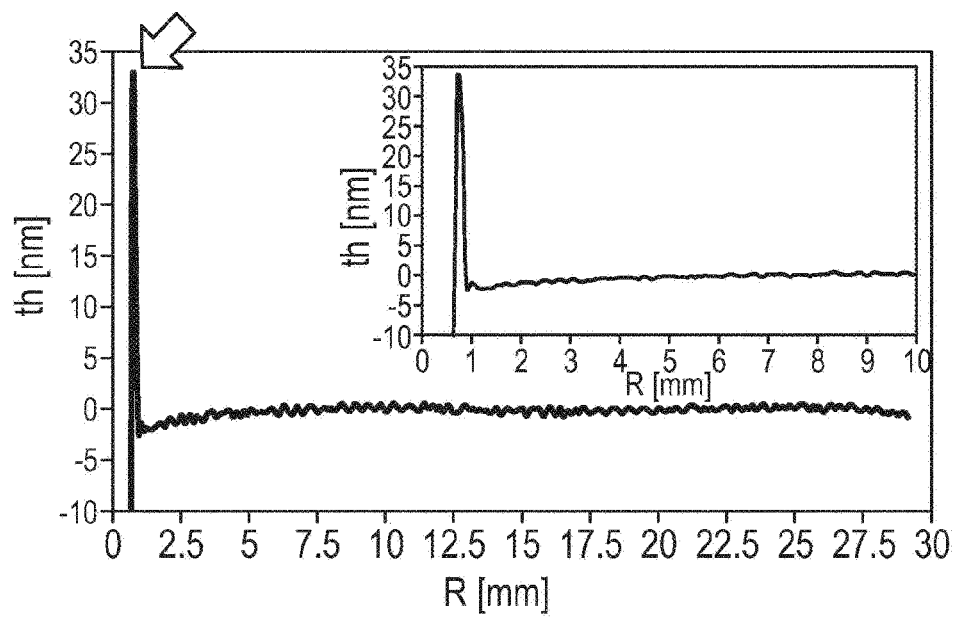
FIG. 9 and FIG. 10 show measurement results for two epitaxially coated semiconductor wafers, relating to differences in thickness in the edge region.
Figure 10:
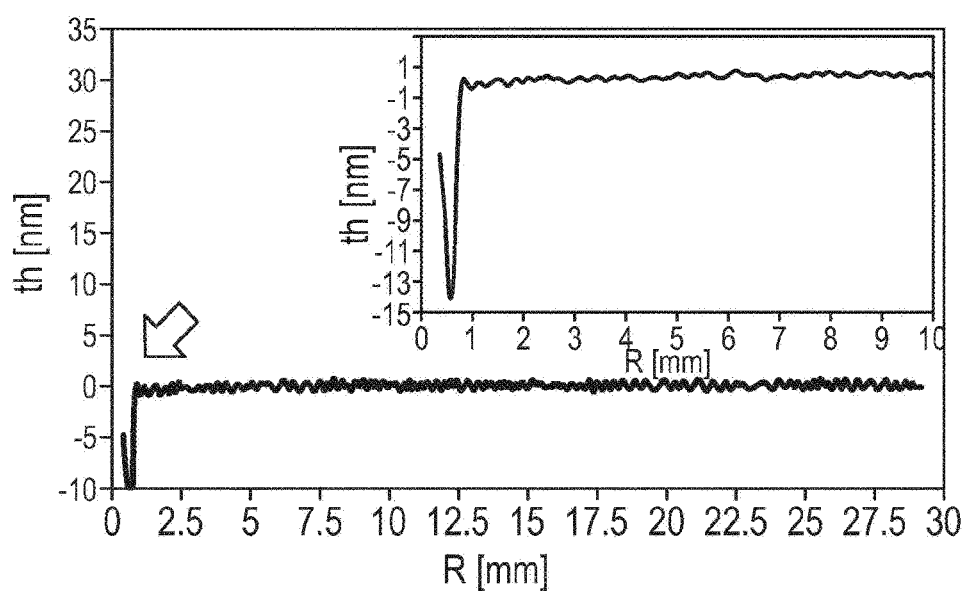

FIG. 9 and FIG. 10 show, on two epitaxially coated semiconductor wafers, measurement results for differences in thickness th in the edge region. What is shown in each case is the profile of the respective difference in thickness which is found after an etching step having the duration 60 s, according to the manner of performance of the method. The difference in thickness arises by a comparison of the thickness of the respective semiconductor wafer in the condition before and after the etching step. In a smaller figure, the critical profile at the distance R from the edge of the semiconductor wafer is emphasized by enlargement.

If the procedure of the first preferred embodiment is followed, i.e. the semiconductor wafer, during the etching step with hydrogen chloride, lies on the susceptor such that the second side (BS) faces the susceptor and the first side (FS) bears a protective layer, a typical steep rise in the thickness profile in the edge region is apparent, which is emphasized by an arrow (FIG. 9). It is precisely this steep rise in the thickness profile which, specifically in the case of epitaxially coated semiconductor wafers according to the prior art, crucially limits the achievable flatness with low edge exclusion (<2 mm).

If the procedure of the second preferred embodiment is followed, i.e. the semiconductor wafer, during the etching step, lies on the susceptor such that the second side (BS) faces the susceptor and the second side bears a protective layer (BS), the semiconductor wafer remains virtually homogeneously flat during the heating and etching operation, which is likewise emphasized by an arrow (FIG. 10). This advantage allows the manufacturing of semiconductor wafers with superior flatness/planarity with an edge exclusion of 2 mm and down to very small edge exclusions of <0.5 mm.

In addition, for performance of each embodiment, it may be the case that at least one operating parameter of the respective processing operation is defined for every respective processing operation (for example polishing by DSP, polishing by CMP, etching step(s) and deposition of an epitaxial layer (EPI)), specifically
based on at least one wafer parameter which is determined on the semiconductor wafer to be processed;
based on an actual state of a processing apparatus with which the respective processing operation is conducted; and
based on an optimization of wafer parameters for characterization of flatness with regard to the condition thereof after undergoing the three processing operations instead of an optimization of these wafer parameters with regard to the condition thereof after every individual processing operation of the three.

Figure 11:
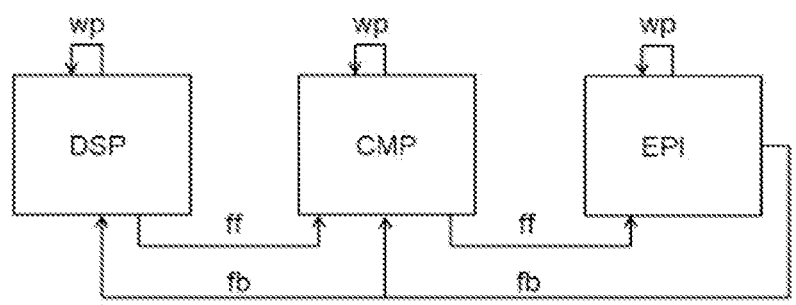
FIG. 11 shows a flow diagram for control of operating parameters.

FIG. 11 shows this in a representative manner for the processing steps of DSP, CMP and EPI. For each of the three processing operations, information is provided in order to be able to define at least one operating parameter specific to each processing apparatus:

At least one wafer parameter is determined on the semiconductor wafer to be processed, in order to define at least one operating parameter for the subsequent processing operation (cross-process feedforward, ff).

The actual state of the respective processing apparatus (DSP, CMP, EPI) is assessed with reference to the semiconductor wafer being processed, and on this basis at least one operating parameter of the processing apparatus being assessed is defined for the processing of a subsequent semiconductor wafer with this processing apparatus (within-process feedback, wp).

After passing through the three processing operations, parameters of the processed semiconductor wafer which characterize the flatness thereof are considered, for example $ESFQR_{max}$ and $SFQR_{max}$, and compared with the respective target values in order to define at least one operating parameter for one or more of the three processing operations for processing of a subsequent semiconductor wafer (cross-process feedback, fb).

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A semiconductor wafer having a front surface comprising an epitaxial layer of silicon deposited on a top surface of a monocrystalline silicon substrate wafer, and having a maximum Edge Site Front Surface-referenced least squares range ($ESFQR_{max}$) of not more than 5 nm with an edge exclusion ($R_1$) of not more than 2 mm and 72 sectors each having a length ($R_2$) of 30 mm.

2. The semiconductor wafer of claim 1, further comprising a maximum Edge Site Front Surface-referenced least squares range ($ESFQR_{max}$) of not more than 10 nm with an edge exclusion ($R_1'$) of not more than 1 mm and 72 sectors each having a length ($R_2'$) of 30 mm.

3. The semiconductor wafer of claim 1, further comprising a maximum Edge Site Front Surface-referenced least squares range ($ESFQR_{max}$) of not more than 15 nm with an edge exclusion ($R_1''$) of not more than 0.5 mm and 72 sectors each having a length ($R_2''$) of 30 mm.

4. The semiconductor wafer of claim 1, wherein the monocrystalline silicon substrate wafer has a {100} or {110} orientation, and the monocrystalline silicon substrate wafer top surface adjoining the epitaxial silicon layer has anti-fourfold symmetry.

5. The semiconductor wafer of claim 1, wherein the monocrystalline silicon substrate wafer has a {100} or {110} orientation, the monocrystalline silicon substrate wafer top surface adjoining the epitaxial silicon layer has anti-fourfold symmetry, and the semiconductor wafer front surface has fourfold symmetry.

6. The semiconductor wafer of claim 1, further comprising a back surface coated with a low temperature oxide layer with a thickness of less than 200 nm, up to an edge exclusion of 0.5 mm.

7. The semiconductor wafer of claim 1, further comprising a back surface coated with low temperature oxide layer with a thickness of less than 200 nm, up to an edge exclusion of 0.2 mm.

8. The semiconductor wafer of claim 1, further comprising a back surface coated with low temperature oxide layer with a thickness of less than 200 nm, up to an edge exclusion of 0.1 mm.

9. The semiconductor wafer of claim 2, further comprising a back surface coated with low temperature oxide layer with a thickness of less than 150 nm, up to an edge exclusion of 0.5 mm.

10. The semiconductor wafer of claim 2, further comprising a back surface coated with low temperature oxide layer with a thickness of less than 150 nm, up to an edge exclusion of 0.2 mm.

11. The semiconductor wafer of claim 2, further comprising a back surface coated with low temperature oxide layer with a thickness of less than 200 nm, up to an edge exclusion of 0.1 mm.

12. The semiconductor wafer of claim 3, further comprising a back surface coated with low temperature oxide layer with a thickness of less than 100 nm, up to an edge exclusion of 0.5 mm.

13. The semiconductor wafer of claim 3, further comprising a back surface coated with low temperature oxide layer with a thickness of less than 100 nm, up to an edge exclusion of 0.2 mm.

14. The semiconductor wafer of claim 3, further comprising a back surface coated with low temperature oxide with a thickness of less than 100 nm, up to an edge exclusion of 0.1 mm.

15. A semiconductor wafer having a front surface comprising an epitaxial layer of silicon deposited on a top surface of a monocrystalline silicon substrate wafer, and having a maximum Edge Site Front Surface-referenced least squares range ($ESFQR_{max}$) of not more than 5 nm with an edge exclusion ($R_1$) of not more than 2 mm and 72 sectors each having a length ($R_2$) of 30 mm, a maximum Edge Site Front Surface-referenced least squares range ($ESFQR_{max}$) of not more than 10 nm with an edge exclusion ($R_1'$) of not more than 1 mm and 72 sectors each having a length ($R_2'$) of 30 mm, and a maximum Edge Site Front Surface-referenced least squares range ($ESFQR_{max}$) of not more than 15 nm with an edge exclusion ($R_1''$) of not more than 0.5 mm and 72 sectors each having a length ($R_2''$) of 30 mm.

* * * * *